United States Patent
Sakui et al.

(10) Patent No.: US 12,279,412 B2
(45) Date of Patent: Apr. 15, 2025

(54) SEMICONDUCTOR ELEMENT MEMORY DEVICE

(71) Applicant: Unisantis Electronics Singapore Pte. Ltd., Singapore (SG)

(72) Inventors: Koji Sakui, Tokyo (JP); Nozomu Harada, Tokyo (JP)

(73) Assignee: UNISANTIS ELECTRONICS SINGAPORE PTE. LTD., Singapore (SG)

(*) Notice: Subject to any disclaimer, the term of this patent is extended or adjusted under 35 U.S.C. 154(b) by 148 days.

(21) Appl. No.: 18/326,709

(22) Filed: May 31, 2023

(65) Prior Publication Data

US 2023/0309288 A1 Sep. 28, 2023

Related U.S. Application Data

(63) Continuation of application No. PCT/JP2021/004052, filed on Feb. 4, 2021.

(51) Int. Cl.
*G11C 11/34* (2006.01)
*G11C 11/404* (2006.01)
(Continued)

(52) U.S. Cl.
CPC ............ *H10B 12/20* (2023.02); *G11C 11/404* (2013.01); *G11C 11/4096* (2013.01)

(58) Field of Classification Search
CPC .... H10B 12/20; G11C 11/404; G11C 11/4096
(Continued)

(56) References Cited

U.S. PATENT DOCUMENTS 11,682,443 B2* 6/2023 Sakui ................. G11C 14/0018
   365/184
11,756,603 B2* 9/2023 Harada ................. G11C 5/025
   365/149
(Continued)

FOREIGN PATENT DOCUMENTS

JP   02-188966 A   7/1990
JP   03-171768 A   7/1991
(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, vol. 38, No. 3, pp. 573-578 (1991).

(Continued)

*Primary Examiner* — Viet Q Nguyen
(74) *Attorney, Agent, or Firm* — Crowell & Moring LLP

(57) ABSTRACT

On a substrate Sub, a semiconductor base material (Si pillar) that stands on the substrate in a vertical direction or that extends along the substrate in a horizontal direction a first impurity layer and a second impurity layer that are disposed on respective ends of the semiconductor base material, a first gate conductor layer, and a second gate conductor layer that surround the semiconductor base material between the first impurity layer and the second impurity layer, and a channel semiconductor layer are disposed. Voltages are applied to perform a memory write operation of discharging a group of electrons from the channel semiconductor layer and retaining some of a group of positive holes in the channel semiconductor layer generated inside the channel semiconductor layer by a gate-induced drain leakage current, and a memory erase operation of discharging the group of positive holes retained in the channel semiconductor layer.

8 Claims, 10 Drawing Sheets

(51) Int. Cl.
  *G11C 11/4096*  (2006.01)
  *H10B 12/00*  (2023.01)
(58) Field of Classification Search
  USPC .......................................................... 365/184
  See application file for complete search history.

(56) References Cited

U.S. PATENT DOCUMENTS

| | | | | |
|---|---|---|---|---|
| 11,776,609 | B2* | 10/2023 | Harada | H01L 29/66666 |
| | | | | 365/149 |
| 11,776,620 | B2* | 10/2023 | Sakui | G11C 11/4076 |
| | | | | 365/189.011 |
| 11,823,726 | B2* | 11/2023 | Sakui | G11C 16/0466 |
| 11,823,727 | B2* | 11/2023 | Sakui | G11C 16/14 |
| 11,915,757 | B2* | 2/2024 | Sakui | G11C 16/02 |
| 11,917,807 | B2* | 2/2024 | Sakui | G11C 5/063 |
| 11,925,013 | B2* | 3/2024 | Harada | G11C 11/4094 |
| 11,968,822 | B2* | 4/2024 | Harada | G11C 11/4096 |
| 11,968,922 | B2* | 4/2024 | Strnad | A01B 61/00 |
| 11,980,022 | B2* | 5/2024 | Kakumu | G11C 11/4096 |
| 12,048,140 | B2* | 7/2024 | Sakui | G11C 16/26 |
| 12,096,611 | B2* | 9/2024 | Sakui | G11C 11/4097 |
| 12,100,443 | B2* | 9/2024 | Sakui | G11C 16/24 |
| 12,120,864 | B2* | 10/2024 | Sakui | G11C 11/4096 |
| 12,131,773 | B2* | 10/2024 | Sakui | G11C 16/10 |
| 12,159,923 | B2* | 12/2024 | Harada | H01L 29/78642 |
| 2003/0111681 | A1 | 6/2003 | Kawanaka | |
| 2006/0049444 | A1 | 3/2006 | Shino | |
| 2008/0137394 | A1 | 6/2008 | Shimano et al. | |
| 2008/0212366 | A1 | 9/2008 | Ohsawa | |
| 2022/0310608 | A1* | 9/2022 | Harada | H10B 12/20 |
| 2022/0320092 | A1* | 10/2022 | Chiang | H01L 23/5283 |
| 2022/0320097 | A1* | 10/2022 | Harada | H10B 12/20 |
| 2022/0344336 | A1* | 10/2022 | Sakui | H10B 12/05 |
| 2022/0359521 | A1* | 11/2022 | Sakui | H10B 12/036 |
| 2022/0367473 | A1* | 11/2022 | Sakui | G11C 11/406 |
| 2022/0367680 | A1* | 11/2022 | Sakui | H01L 27/1203 |
| 2022/0392900 | A1* | 12/2022 | Harada | H10B 12/036 |
| 2022/0406781 | A1* | 12/2022 | Sakui | G11C 11/406 |
| 2023/0115460 | A1* | 4/2023 | Sakui | G11C 11/4096 |
| | | | | 365/184 |
| 2023/0301057 | A1* | 9/2023 | Harada | H01L 29/7841 |
| 2023/0377634 | A1* | 11/2023 | Sakui | G11C 11/4096 |
| 2023/0377635 | A1* | 11/2023 | Sakui | H10B 12/00 |
| 2023/0377636 | A1* | 11/2023 | Sakui | G11C 11/404 |
| 2023/0377658 | A1* | 11/2023 | Sakui | G11C 11/409 |
| 2023/0380139 | A1* | 11/2023 | Sakui | G11C 16/04 |
| 2023/0389274 | A1* | 11/2023 | Sakui | G11C 11/404 |
| 2023/0410893 | A1* | 12/2023 | Sakui | G11C 11/4087 |
| 2023/0410894 | A1* | 12/2023 | Sakui | H10B 12/20 |
| 2024/0074140 | A1* | 2/2024 | Kakumu | G11C 11/404 |

FOREIGN PATENT DOCUMENTS

| | | |
|---|---|---|
| JP | 2006-080280 A | 3/2006 |
| JP | 3957774 B2 | 8/2007 |
| JP | 2008-218556 A | 9/2008 |

OTHER PUBLICATIONS

H. Chung, H. Kim, H. Kim, K. Kim, K. Song, J. Kim, Y.C. Oh, Y. Hwang, H. Hong, G. Jin, and C. Chung: "Novel 4F2 DRAM Cell with Vertical Pillar Transistor(VPT)," 2011 Proceeding of the European Solid-State Device Research Conference, (2011).

H. S. Philip Wong, S. Raoux, S. Kim, Jiale Liang, J. P. Reifenberg, B. Rajendran, M. Asheghi and K. E. Goodson: "Phase Change Memory," Proceeding of IEEE, vol. 98, No. 12, December, pp. 2201-2227 (2010).

K. Tsunoda, K .Kinoshita, H. Noshiro, Y. Yamazaki, T. Iizuka, Y. Ito, A. Takahashi, A. Okano, Y. Sato, T. Fukano, M. Aoki, and Y. Sugiyama : "Low Power and high Speed Switching of Ti-doped NiO ReRAM under the Unipolar Voltage Source of less than 3V," IEDM (2007).

W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015).

M. G. Ertosun, K. Lim, C. Park, J. Oh, P. Kirsch, and K. C. Saraswat: "Novel Capacitorless Single-Transistor Charge-Trap DRAM (1T CT DRAM) Utilizing Electrons," IEEE Electron Device Letter, vol. 31, No. 5, pp. 405-407 (2010).

J. Wan, L. Royer, A. Zaslavsky, and S. Cristoloveanu: "A Compact Capacitor-Less High-Speed DRAM Using Field Effect-Controlled Charge Regeneration," Electron Device Letters, vol. 33, No. 2, pp. 179-181 (2012).

T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp. 1510-1522 (2002).

T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32nm Node and Beyond," IEEE IEDM (2006).

E. Yoshida, T. Tanaka: "A Design of a Capacitorless 1T-DRAM Cell Using Gate-induced Drain Leakage (GIDL) Current for Low-power and High-speed Embedded Memory," IEEE IEDM (2003).

J. Y. Song, W. Y. Choi, J. H. Park, J. D. Lee, and B-G. Park: "Design Optimization of Gate-All-Around (GAA) MOSFETs," IEEE Trans. Electron Devices, vol. 5, No. 3, pp. 186-191, May 2006.

N. Loubet, et al.: "Stacked Nanosheet Gate-All-Around Transistor to Enable Scaling Beyond FinFET," 2017 IEEE Symposium on VLSI Technology Digest of Technical Papers, T17-5, T230-T231, Jun. 2017.

H. Jiang, N. Xu, B. Chen, L. Zeng, Y. He, G. Du, X. Liu and X. Zhang: "Experimental investigation of self heating effect (SHE) in multiple-fin SOI FinFETs," Semicond. Sci. Technol. 29 (2014) 115021 (7pp).

E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697,Apr. 2006.

F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI," IEICE Trans. Electron., vol. E90-c., No. 4 pp. 765-771 (Apr. 2007), 7 pages.

* cited by examiner

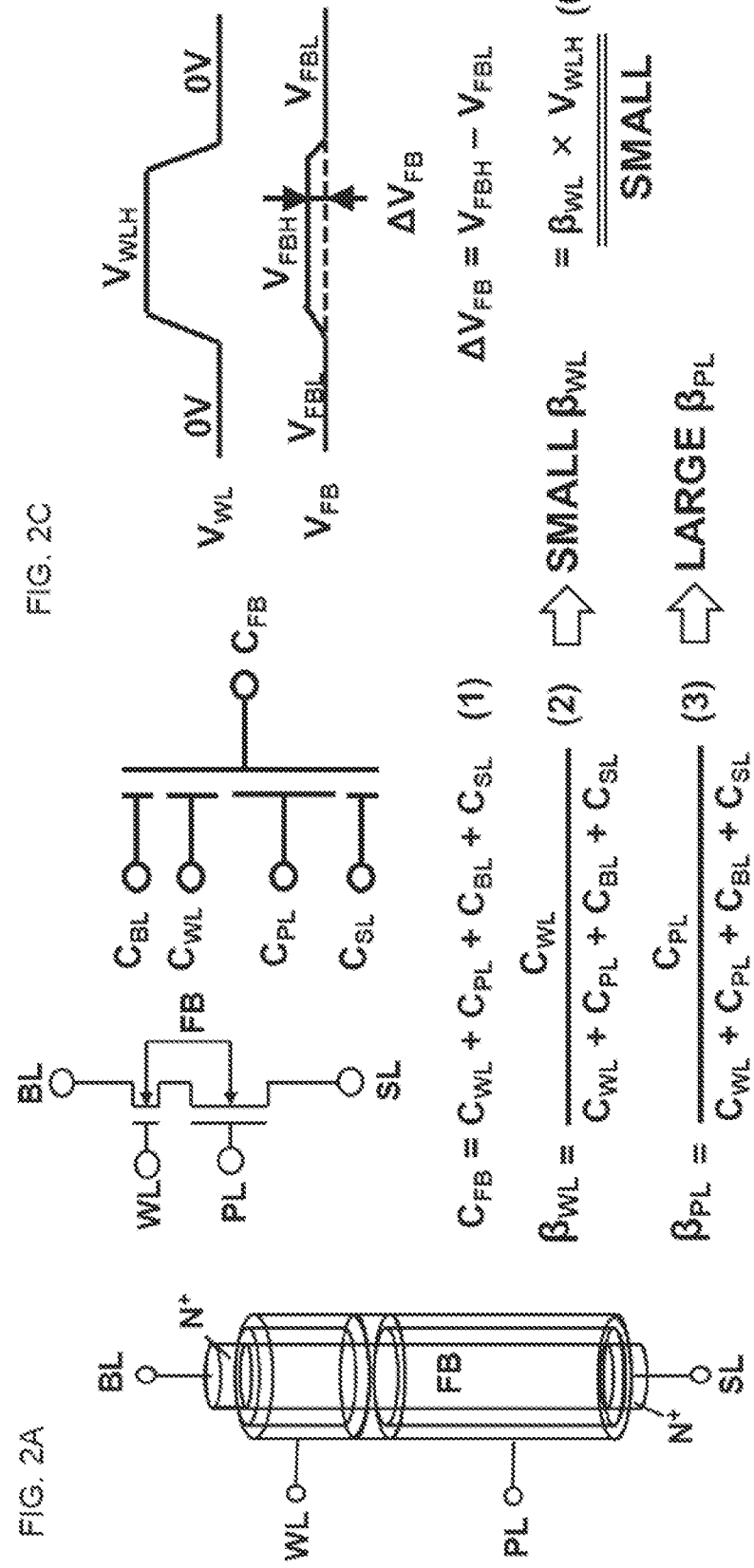

FIG. 3B

| SELECTED/ NON-SELECTED | SIGNAL LINE | APPLIED VOLTAGE |
|---|---|---|
| WRITE "1" | BIT LINE BL | $V_{BL1}$ (e.g. 3.5V) |
| | SOURCE LINE SL | $V_{SLH}$ (e.g. 2.5V) |
| | PLATE LINE PL | $V_{PL}$ (e.g. 1V) |
| | WORD LINE WL | $V_{WL1}$ (e.g. 0V) |
| | FLOATING BODY FB | $V_b$ (e.g. 0.7V) |
| NOT WRITE "0" (MAINTAIN "0" ERASE) | BIT LINE BL | $V_{BL0}$ (e.g. 2.5V) |
| | SOURCE LINE SL | $V_{SLH}$ (e.g. 2.5V) |
| | PLATE LINE PL | $V_{PL}$ (e.g. 1V) |
| | WORD LINE WL | $V_{WL0}$ (e.g. 2.5V) |
| | FLOATING BODY FB | $V_{ERA} + V_b$ (e.g. -3V + 0.7V = -2.3V) |

$V_b$: BUILT-IN VOLTAGE OF PN JUNCTION 0.7V

Vb: Built-in Voltage 0.7V

FIG. 4B

| | SIGNAL LINE | APPLIED VOLTAGE |
|---|---|---|
| "0" ERASE | BIT LINE BL | FLOATING OR $V_{ERA}$ (e.g. -3V) |
| | SOURCE LINE SL | $V_{ERA}$ (e.g. -3V) |
| | PLATE LINE PL | $V_{PL}$ (e.g. 1V) |
| | WORD LINE WL | $V_{SS}$ (e.g. 0V) |
| | FLOATING BODY FB | $V_{ERA} + V_b$ (e.g. -3V + 0.7V = -2.3V) |

Vb: BUILT-IN VOLTAGE OF PN JUNCTION 0.7V

Vb: BUILT-IN VOLTAGE 0.7V $$C_{FB} = C_{WL} + C_{BL} + C_{SL} \quad (7)$$

$$\beta_{WL} = \frac{C_{WL}}{C_{WL} + C_{BL} + C_{SL}} \quad (8)$$

$$\Delta V_{FB} = V_{FB2} - V_{FB1} = \beta_{WL} \times V_{WLH} \quad (9)$$

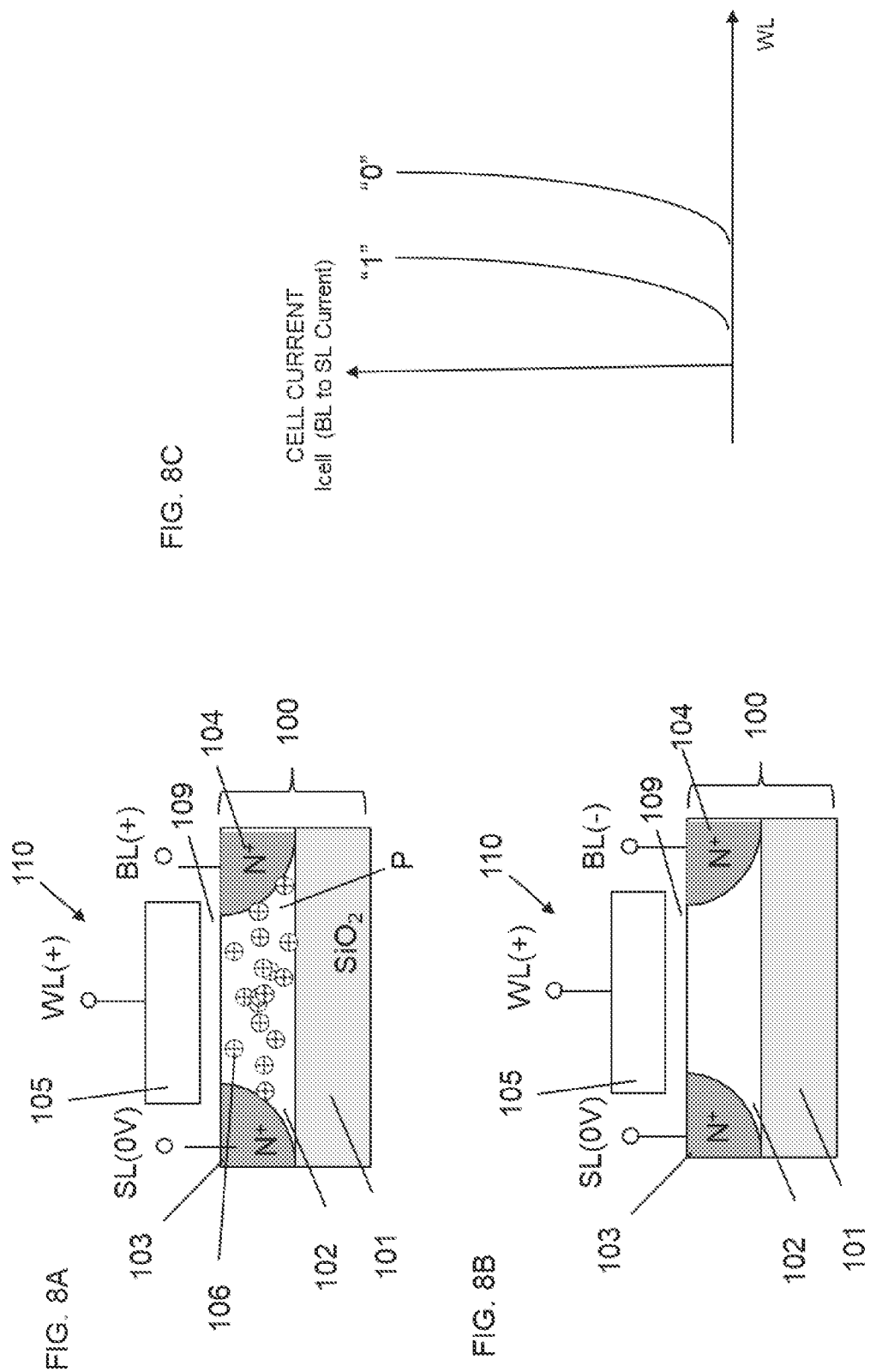

SEMICONDUCTOR ELEMENT MEMORY DEVICE

CROSS REFERENCES TO RELATED APPLICATIONS

The present application is a continuation application of PCT/JP2021/004052, filed Feb. 4, 2021, the entire contents of which are incorporated herein by reference.

BACKGROUND OF THE INVENTION

1. Field of the Invention

The present invention relates to a semiconductor-element-including semiconductor memory device.

2. Description of the Related Art

Recently, there has been a demand for highly integrated and high-performance memory elements in the development of LSI (Large Scale Integration) technology.

Typical planar MOS transistors include a channel that extends in a horizontal direction along the upper surface of the semiconductor substrate. In contrast, SGTs include a channel that extends in a direction perpendicular to the upper surface of the semiconductor substrate (see, for example, Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). Accordingly, the density of semiconductor devices can be made higher with SGTs than with planar MOS transistors. Such SGTs can be used as selection transistors to implement highly integrated memories, such as a DRAM (Dynamic Random Access Memory, see, for example, H. Chung, H. Kim, H. Kim, K. Kim, S. Kim, K. W. Song, J. Kim, Y. C. Oh, Y. Hwang, H. Hong, G. Jin, and C. Chung: "4F2 DRAM Cell with Vertical Pillar Transistor (VPT)", 2011 Proceeding of the European Solid-State Device Research Conference, (2011)) to which a capacitor is connected, a PCM (Phase Change Memory, see, for example, H. S. Philip Wong, S. Raoux, S. Kim, Jiale Liang, J. R. Reifenberg, B. Rajendran, M. Asheghi and K. E. Goodson: "Phase Change Memory", Proceeding of IEEE, Vol. 98, No. 12, December, pp. 2201-2227 (2010)) to which a resistance change element is connected, an RRAM (Resistive Random Access Memory, see, for example, K. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3V", IEDM (2007)), and an MRAM (Magneto-resistive Random Access Memory, see, for example, W. Kang, L. Zhang, J. Klein, Y. Zhang, D. Ravelosona, and W. Zhao: "Reconfigurable Codesign of STT-MRAM Under Process Variations in Deeply Scaled Technology", IEEE Transaction on Electron Devices, pp. 1-9 (2015)) that changes the resistance by changing the orientation of a magnetic spin with a current. Further, there exists, for example, a DRAM memory cell (see, for example, Japanese Unexamined Patent Application Publication No. 3-171768 and M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron", IEEE Electron Device Letter, Vol. 31, No. 5, pp. 405-407 (2010)) constituted by a single MOS transistor and including no capacitor. The present application relates to a dynamic flash memory that can be constituted only by a MOS transistor and that includes no resistance change element or capacitor.

FIGS. 6A to 6D illustrate a write operation of a DRAM memory cell constituted by a single MOS transistor and including no capacitor described above, FIGS. 7A and 7B illustrate a problem in the operation, and FIGS. 8A to 8C illustrate a read operation (see, for example, J. Wan, L. Rojer, A. Zaslaysky, and S. Critoloveanu: "A Compact Capacitor-Less High-Speed DRAM Using Field Effect-Controlled Charge Regeneration", Electron Device Letters, Vol. 35, No. 2, pp. 179-181 (2012), T. Ohsawa, K. Fujita, T. Higashi, Y. Iwata, T. Kajiyama, Y. Asao, and K. Sunouchi: "Memory design using a one-transistor gain cell on SOI", IEEE JSSC, vol. 37, No. 11, pp. 1510-1522 (2002), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond", IEEE IEDM (2006), and E. Yoshida and T. Tanaka: "A Design of a Capacitorless 1T-DRAM Cell Using Gate-Induced Drain Leakage (GIDL) Current for Low-Power and High-Speed Embedded Memory", IEEE IEDM (2003)). FIG. 6A illustrates a "1" write state. Here, the memory cell is formed on an SOI substrate 100, is constituted by a source $N^+$ layer 103 (hereinafter, a semiconductor region that contains a donor impurity in high concentrations is referred to as "$N^+$ layer") to which a source line SL is connected, a drain $N^+$ layer 104 to which a bit line BL is connected, a gate conductor layer 105 to which a word line WL is connected, and a floating body 102 of a MOS transistor 110, and includes no capacitor. The single MOS transistor 110 constitutes the DRAM memory cell. Directly under the floating body 102, a $SiO_2$ layer 101 of the SOI substrate is in contact with the floating body 102. To write "1" to the memory cell constituted by the single MOS transistor 110, the MOS transistor 110 is operated in the saturation region. That is, a channel 107, for electrons, extending from the source $N^+$ layer 103 has a pinch-off point 108 and does not reach the drain $N^+$ layer 104 to which the bit line is connected. When a high voltage is applied to both the bit line BL connected to the drain $N^+$ layer and the word line WL connected to the gate conductor layer 105, and the MOS transistor 110 is operated at the gate voltage that is about one-half of the drain voltage, the electric field intensity becomes maximum at the pinch-off point 108 that is in the vicinity of the drain $N^+$ layer 104. As a result, accelerated electrons that flow from the source $N^+$ layer 103 toward the drain $N^+$ layer 104 collide with the Si lattice, and with kinetic energy lost at the time of collision, electron-positive hole pairs are generated. Most of the generated electrons (not illustrated) reach the drain $N^+$ layer 104. Further, a very small proportion of the electrons that are very hot pass through a gate oxide film 109 and reach the gate conductor layer 105. With positive holes 106 that are simultaneously generated, the floating body 102 is charged. In this case, the generated positive holes contribute to an increase in the majority carriers because the floating body 102 is P-type Si. When the floating body 102 is filled with the generated positive holes 106 and the voltage of the floating body 102 becomes higher than that of the source $N^+$ layer 103 by Vb or more, further generated positive holes are discharged to the source $N^+$ layer 103. Here, Vb is the built-in voltage of the PN junction between the source $N^+$ layer 103 and the P-layer floating body 102 and is equal to about 0.7 V. FIG. 6B illustrates a state in which the floating body 102 is charged to saturation with the generated positive holes 106.

Now, a "0" write operation of the memory cell 110 will be described with reference to FIG. 6C. For the common selected word line WL, the memory cell 110 to which "1" is written and the memory cell 110 to which "0" is written are present at random. FIG. 6C illustrates a state of rewriting from a "1" write state to a "0" write state. To write "0", the voltage of the bit line BL is set to a negative bias, and the PN junction between the drain $N^+$ layer 104 and the P-layer floating body 102 is forward biased. As a result, the positive holes 106 in the floating body 102 generated in advance in the previous cycle flow into the drain $N^+$ layer 104 that is connected to the bit line BL. When the write operation ends, the two memory cells are in a state in which the memory cell 110 (FIG. 6B) is filled with the generated positive holes 106, and from the memory cell 110 (FIG. 6C), the generated positive holes are discharged. The potential of the floating body 102 of the memory cell 110 filled with the positive holes 106 becomes higher than that of the floating body 102 in which the generated positive holes are not present. Therefore, the threshold voltage of the memory cell 110 to which "1" is written becomes lower than the threshold voltage of the memory cell 110 to which "0" is written. This is illustrated in FIG. 6D.

Now, a problem in the operation of the memory cell constituted by the single MOS transistor 110 will be described with reference to FIGS. 7A and 7B. As illustrated in FIG. 7A, the capacitance $C_{FB}$ of the floating body is equal to the sum of the capacitance $C_{WL}$ between the gate to which the word line is connected and the floating body, the junction capacitance $C_{SL}$ of the PN junction between the source $N^+$ layer 103 to which the source line is connected and the floating body 102, and the junction capacitance $C_{BL}$ of the PN junction between the drain $N^+$ layer 104 to which the bit line is connected and the floating body 102 and is expressed as follows.

$$C_{FB}=C_{WL}+C_{BL}+C_{SL} \quad (7)$$

The capacitive coupling ratio $\beta_{WL}$ between the gate to which the word line is connected and the floating body is expressed as follows.

$$\beta_{WL}=C_{WL}/(C_{WL}+C_{BL}+C_{SL}) \quad (8)$$

Therefore, a change in the word line voltage $V_{WL}$ at the time of reading or writing affects the voltage of the floating body 102 that functions as a storage node (contact point) of the memory cell. This is illustrated in FIG. 7B. When the word line voltage $V_{WL}$ rises from 0 V to $V_{WLH}$ at the time of reading or writing, the voltage $V_{FB}$ of the floating body 102 rises from $V_{FB1}$, which is the voltage in the initial state before the word line voltage changes, to $V_{FB2}$ due to capacitive coupling with the word line. The voltage change amount $\Delta V_{FB}$ is expressed as follows.

$$\Delta V_{FB} = V_{FB2} - V_{FB1} = \beta_{WL} \times V_{WLH} \quad (9)$$

Here, for $\beta_{WL}$ in expression (8), the contribution ratio of $C_{WL}$ is large and, for example, $C_{WL}:C_{BL}:C_{SL}=8:1:1$ holds. This results in $\beta_{WL}=0.8$. When the word line changes, for example, from 5 V at the time of writing to 0 V after the end of writing, the floating body 102 receives an amplitude noise of 5 V×$\beta_{WL}$=4 V due to capacitive coupling between the word line WL and the floating body 102. Accordingly, a sufficient margin is not provided to the potential difference between the "1" potential and the "0" potential of the floating body 102 at the time of writing, which is a problem.

FIGS. 8A to 8C illustrate a read operation where FIG. 8A illustrates a "1" write state and FIG. 8B illustrates a "0" write state. In actuality, however, even when Vb is set for the floating body 102 to write "1", once the word line returns to 0 V at the end of writing, the floating body 102 is lowered to a negative bias. When "0" is written, the floating body 102 is lowered to a further negative bias, and it is difficult to provide a sufficiently large margin to the potential difference between "1" and "0" at the time of writing as illustrated in FIG. 8C. Therefore, there is difficulty in commercially introducing DRAM memory cells actually including no capacitor.

SUMMARY OF THE INVENTION

In capacitor-less single-transistor DRAMs (gain cells), capacitive coupling between the word line and the floating body is strong. When the potential of the word line is changed at the time of data reading or at the time of data writing, the change is directly transmitted to the floating body as noise, which is a problem. This causes a problem of erroneous reading or erroneous rewriting of storage data and makes it difficult to commercially introduce capacitor-less single-transistor DRAMs (gain cells).

To address the above-described problems, a semiconductor memory device according to the present invention includes:

a semiconductor base material that stands on a substrate in a vertical direction relative to the substrate or that extends along the substrate in a horizontal direction;

a first impurity layer and a second impurity layer that are disposed at respective ends of the semiconductor base material;

a first gate insulating layer that partially or entirely surrounds a side surface of the semiconductor base material between the first impurity layer and the second impurity layer and that is in contact with or in close vicinity to the first impurity layer;

a second gate insulating layer that partially or entirely surrounds the side surface of the semiconductor base material, that is connected to the first gate insulating layer, and that is in contact with or in close vicinity to the second impurity layer;

a first gate conductor layer that covers the first gate insulating layer;

a second gate conductor layer that covers the second gate insulating layer; and a channel semiconductor layer that is the semiconductor base material and that is constituted by a first channel semiconductor layer covered by the first gate insulating layer and a second channel semiconductor layer covered by the second gate insulating layer, in which a memory write operation is performed by controlling voltages applied to the first gate conductor layer, the second gate conductor layer, the first impurity layer, and the second impurity layer to perform an operation of discharging a group of electrons among the group of electrons and a group of positive holes through the first impurity layer or the second impurity layer, the group of electrons and the group of positive holes being generated inside the channel semiconductor layer in a first boundary region between the first impurity layer and the channel semiconductor layer or in a second boundary region between the second impurity layer and the channel semiconductor layer by a gate-induced drain leakage current, and an operation of keeping some or all of the group of positive holes retained in the channel semiconductor layer, and a memory erase operation is performed by controlling the voltages applied to the first gate conductor layer, the second gate conductor layer, the first impurity layer, and the second impurity layer to discharge the group of positive holes through either the first impurity layer or the second impurity layer or both the first impurity layer and the second impurity layer (first invention).

In the first invention described above, in the memory erase operation, a first PN junction between the first impurity layer and the channel semiconductor layer and a second PN junction between the second impurity layer and the channel semiconductor layer are kept in a reverse bias state (second invention).

In the first invention described above, a source line is connected to the first impurity layer, a bit line is connected to the second impurity layer, and when a word line is connected to one of the first gate conductor layer or the second gate conductor layer, a first driving control line is connected to the other of the first gate conductor layer or the second gate conductor layer, and the memory erase operation or the memory write operation is selectively performed in accordance with voltages applied to the source line, the bit line, the first driving control line, and the word line (third invention).

In the third invention described above, the bit line is orthogonal to the word line in plan view (fourth invention).

In the first invention described above, a first gate capacitance between the first gate conductor layer and the channel semiconductor layer is larger than a second gate capacitance between the second gate conductor layer and the channel semiconductor layer (fifth invention).

In the fifth invention described above, the first gate capacitance is made larger than the second gate capacitance by any of making a first channel length of the first gate conductor layer longer than a second channel length of the second gate conductor layer, making the first gate insulating layer thinner than the second gate insulating layer, or making a relative dielectric constant of the first gate insulating layer higher than a relative dielectric constant of the second gate insulating layer, or by a combination thereof (sixth invention).

In the first invention described above, the first impurity layer and the second impurity layer are N-type semiconductor layers, and the channel semiconductor layer is a P-type semiconductor layer or a neutral semiconductor layer, and in response to a start of the memory erase operation, the memory erase operation is performed by performing a group-of-positive-holes discharge operation in which the first impurity layer is set at a voltage lower than a voltage of the channel semiconductor layer, a first PN junction between the first impurity layer and the channel semiconductor layer is forward biased, and the group of positive holes are discharged from the channel semiconductor layer to the first impurity layer, and a group-of-positive-holes discharge stop operation that is subsequently performed and in which the first impurity layer is set at a voltage higher than the voltage of the channel semiconductor layer, the first PN junction is reverse biased, and discharging of the group of positive holes is stopped (seventh invention).

In the first invention described above, the semiconductor memory device includes: the semiconductor base material that is formed perpendicular to a substrate; the first impurity layer that is formed in the semiconductor base material in a vicinity of the substrate; the first channel semiconductor layer that is formed on the first impurity layer in the semiconductor base material; the second channel semiconductor layer that is formed on the first channel semiconductor layer in the semiconductor base material; the second impurity layer that is formed on the second channel semiconductor layer in the semiconductor base material; the first gate insulating layer that surrounds the first channel semiconductor layer; the second gate insulating layer that surrounds the second channel semiconductor layer; the first gate conductor layer that surrounds the first gate insulating layer; the second gate conductor layer that surrounds the second gate insulating layer; and a first insulating layer that is disposed between the first gate conductor layer and the second gate conductor layer (eighth invention).

BRIEF DESCRIPTION OF THE DRAWINGS

FIGS. 2A to 2C are diagrams for explaining an effect attained in a case where the gate capacitance of a first gate conductor layer 5a connected to a plate line PL is made larger than the gate capacitance of a second gate conductor layer 5b to which a word line WL is connected in the SGT-including memory device according to the first embodiment;

FIG. 3B is a diagram for explaining the mechanism of the write operation of the SGT-including memory device according to the first embodiment;

FIG. 4B is a diagram for explaining the mechanism of the erase operation of the SGT-including memory device according to the first embodiment;

FIGS. 8A to 8C are diagrams for explaining a read operation of the DRAM memory cell including no capacitor in the related art.

DESCRIPTION OF THE PREFERRED EMBODIMENTS

Hereinafter, a semiconductor-element-including memory device (hereinafter called a dynamic flash memory) according to the present invention will be described with reference to the drawings.

First Embodiment

The structure and operation mechanisms of a dynamic flash memory cell according to a first embodiment of the present invention will be described with reference to FIG. 1, FIGS. 2A to 2C, FIGS. 3AA to 3AD, FIG. 3B, FIGS. 4AA to 4AC, FIG. 4B, and FIGS. 5A to 5C. The structure of the dynamic flash memory cell will be described with reference to FIG. 1. An effect attained in a case where the gate capacitance of a first gate conductor layer 5a connected to a plate line PL is made larger than the gate capacitance of a second gate conductor layer 5b to which a word line WL is connected will be described with reference to FIGS. 2A to 2C. A mechanism of a data write operation will be described with reference to FIGS. 3AA to 3AD and FIG. 3B, a mechanism of a data erase operation will be described with reference to FIGS. 4AA to 4AC and FIG. 4B, and a mechanism of a data read operation will be described with reference to FIGS. 5A to 5C.

Figure 1:
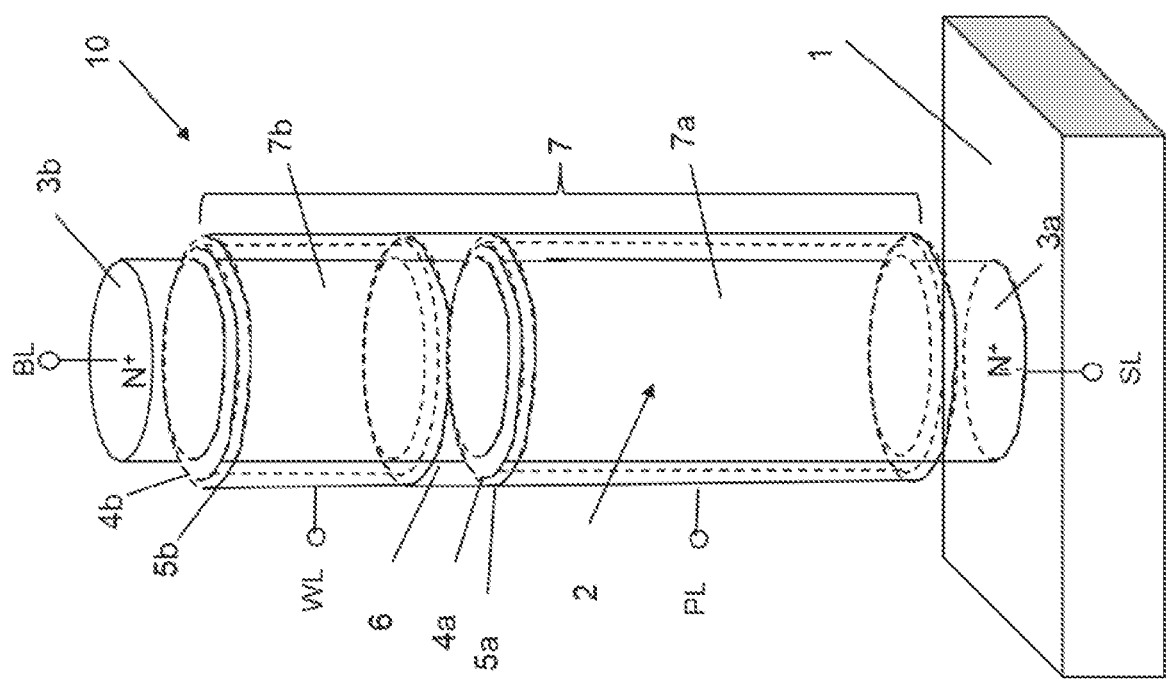
FIG. 1 is a structural diagram of an SGT-including memory device according to a first embodiment.

FIG. 1 illustrates the structure of the dynamic flash memory cell according to the first embodiment of the present invention. On the top and the bottom of a silicon semiconductor pillar 2 (the silicon semiconductor pillar is hereinafter referred to as "Si pillar") (which is an example of "semiconductor base material" in the claims) of the P or i (intrinsic) conductivity type formed on a substrate 1 (which is an example of "substrate" in the claims), N⁺ layers 3a and 3b (which are examples of "first impurity layer" and "second impurity layer" in the claims), one of which functions as the source and the other functions as the drain, are formed respectively. A part of the Si pillar 2 between the N⁺ layers 3a and 3b that function as the source and the drain functions as a channel region 7 (which is an example of "channel semiconductor layer" in the claims). Around the channel region 7, a first gate insulating layer 4a (which is an example of "first gate insulating layer" in the claims) and a second gate insulating layer 4b (which is an example of "second gate insulating layer" in the claims) are formed. The first gate insulating layer 4a and the second gate insulating layer 4b are in contact with or in close vicinity to the N⁺ layers 3a and 3b that function as the source and the drain respectively. Around the first gate insulating layer 4a and the second gate insulating layer 4b, the first gate conductor layer 5a (which is an example of "first gate conductor layer" in the claims) and the second gate conductor layer 5b (which is an example of "second gate conductor layer" in the claims) are formed respectively. The first gate conductor layer 5a and the second gate conductor layer 5b are isolated from each other by an insulating layer 6 (which is an example of "first insulating layer" in the claims). The channel region 7, which is a part of the Si pillar 2 between the N⁺ layers 3a and 3b, is constituted by a first channel Si layer 7a (which is an example of "first channel semiconductor layer" in the claims) surrounded by the first gate insulating layer 4a and a second channel Si layer 7b (which is an example of "second channel semiconductor layer" in the claims) surrounded by the second gate insulating layer 4b. Accordingly, the N⁺ layers 3a and 3b that function as the source and the drain, the channel region 7, the first gate insulating layer 4a, the second gate insulating layer 4b, the first gate conductor layer 5a, and the second gate conductor layer 5b constitute a dynamic flash memory cell 10. The N⁺ layer 3a that functions as the source is connected to a source line SL (which is an example of "source line" in the claims), the N⁺ layer 3b that functions as the drain is connected to a bit line BL (which is an example of "bit line" in the claims), the first gate conductor layer 5a is connected to the plate line PL that is a first driving control line (which is an example of "first driving control line" in the claims), and the second gate conductor layer 5b is connected to the word line WL (which is an example of "word line" in the claims). Desirably, the structure is such that the gate capacitance of the first gate conductor layer 5a to which the plate line PL is connected is larger than the gate capacitance of the second gate conductor layer 5b to which the word line WL is connected.

In FIG. 1, to make the gate capacitance of the first gate conductor layer 5a connected to the plate line PL larger than the gate capacitance of the second gate conductor layer 5b to which the word line WL is connected, the gate length of the first gate conductor layer 5a is made longer than the gate length of the second gate conductor layer 5b. Alternatively, instead of making the gate length of the first gate conductor layer 5a longer than the gate length of the second gate conductor layer 5b, the thicknesses of the respective gate insulating layers may be made different such that the thickness of the gate insulating film of the first gate insulating layer 4a is thinner than the thickness of the gate insulating film of the second gate insulating layer 4b. Alternatively, the dielectric constants of the materials of the respective gate insulating layers may be made different such that the dielectric constant of the gate insulating film of the first gate insulating layer 4a is higher than the dielectric constant of the gate insulating film of the second gate insulating layer 4b. The gate capacitance of the first gate conductor layer 5a connected to the plate line PL may be made larger than the gate capacitance of the second gate conductor layer 5b to which the word line WL is connected, by a combination of any of the lengths of the gate conductor layers 5a and 5b and the thicknesses and dielectric constants of the gate insulating layers 4a and 4b.

FIGS. 2A to 2C are diagrams for explaining an effect attained in a case where the gate capacitance of the first gate conductor layer 5a connected to the plate line PL is made larger than the gate capacitance of the second gate conductor layer 5b to which the word line WL is connected.

FIG. 2A is a simplified structural diagram of the dynamic flash memory cell according to the first embodiment of the present invention and illustrates only main parts. To the dynamic flash memory cell, the bit line BL, the word line WL, the plate line PL, and the source line SL are connected, and the potential state of the channel region 7 is determined by the voltage states of the lines.

FIG. 2B is a diagram for explaining the capacitance relationships of the respective lines. The capacitance $C_{FB}$ of the channel region 7 is equal to the sum of the capacitance $C_{WL}$ between the second gate conductor layer 5b to which the word line WL is connected and the channel region 7, the capacitance $C_{PL}$ between the first gate conductor layer 5a to which the plate line PL is connected and the channel region 7, the junction capacitance $C_{SL}$ of the PN junction between the source N⁺ layer 3a to which the source line SL is connected and the channel region 7, and the junction capacitance $C_{BL}$ of the PN junction between the drain N⁺ layer 3b to which the bit line BL is connected and the channel region 7, and is expressed as follows.

$$C_{FB}=C_{WL}+C_{PL}+C_{BL}+C_{SL} \quad (1)$$

Therefore, the coupling ratio $\beta_{WL}$ between the word line WL and the channel region 7, the coupling ratio $\beta_{PL}$ between the plate line PL and the channel region 7, the coupling ratio $\beta_{BL}$ between the bit line BL and the channel region 7, and the coupling ratio $\beta_{SL}$ between the source line SL and the channel region 7 are expressed as follows.

$$\beta_{WL}=C_{WL}/(C_{WL}+C_{PL}+C_{BL}+C_{SL}) \quad (2)$$

$$\beta_{PL}=C_{PL}/(C_{WL}+C_{PL}+C_{BL}+C_{SL}) \quad (3)$$

$$\beta_{BL}=C_{BL}/(C_{WL}+C_{PL}+C_{BL}+C_{SL}) \quad (4)$$

$$\beta_{SL}=C_{SL}/(C_{WL}+C_{PL}+C_{BL}+C_{SL}) \quad (5)$$

Here, $C_{PL} > C_{WL}$ holds, and therefore, this results in $\beta_{PL} > \beta_{WL}$.

FIG. 2C is a diagram for explaining a change in the voltage $V_{FB}$ of the channel region 7 when the voltage $V_{WL}$ of the word line WL rises at the time of a read operation or a write operation and subsequently drops. Here, the potential difference $\Delta V_{FB}$ when the voltage $V_{FB}$ of the channel region 7 transitions from a low-voltage state $V_{FBL}$ to a high-voltage state $V_{FBH}$ in response to the voltage $V_{WL}$ of the word line WL rising from 0 V to a high-voltage state $V_{WLH}$ is expressed as follows.

$$\Delta V_{FB} = V_{FBH} - V_{FBL}$$

$$= \beta_{WL} \times V_{WLH} \quad (6)$$

The coupling ratio $\beta_{WL}$ between the word line WL and the channel region 7 is small and the coupling ratio $\beta_{PL}$ between the plate line PL and the channel region 7 is large, and therefore, $\Delta V_{FB}$ is small, and the voltage $V_{FB}$ of the channel region 7 negligibly changes even when the voltage $V_{WL}$ of the word line WL changes at the time of a read operation or a write operation.

Figure 3A:
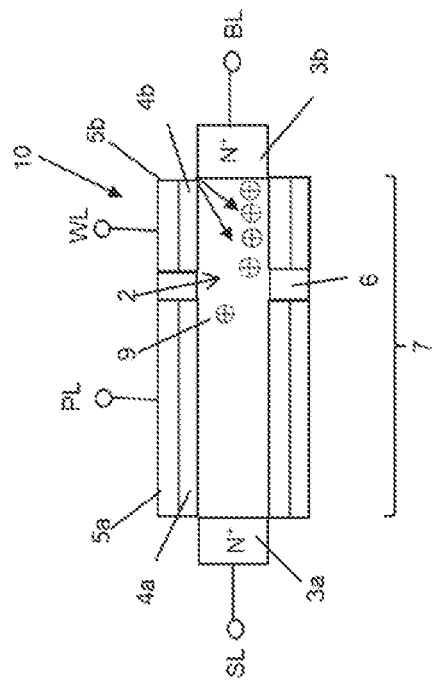
FIGS. 3AA to 3AD are diagrams for explaining a mechanism of a write operation of the SGT-including memory device according to the first embodiment.
Figure 3A:
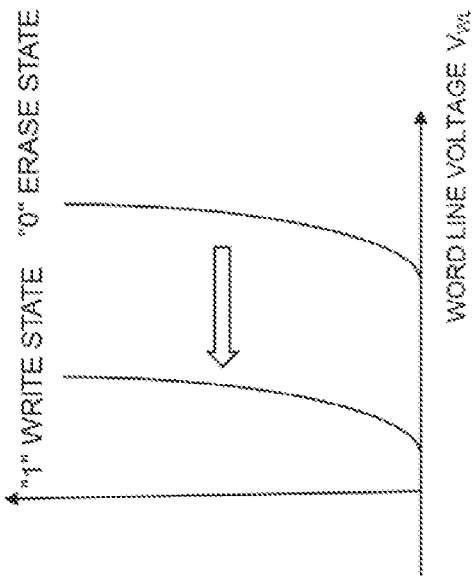
Figure 3A:
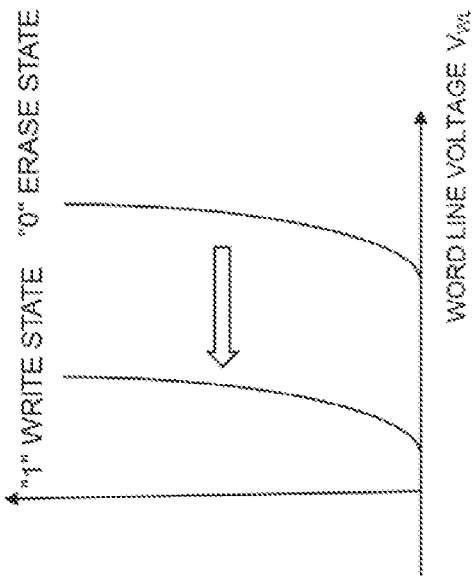
Figure 3A:
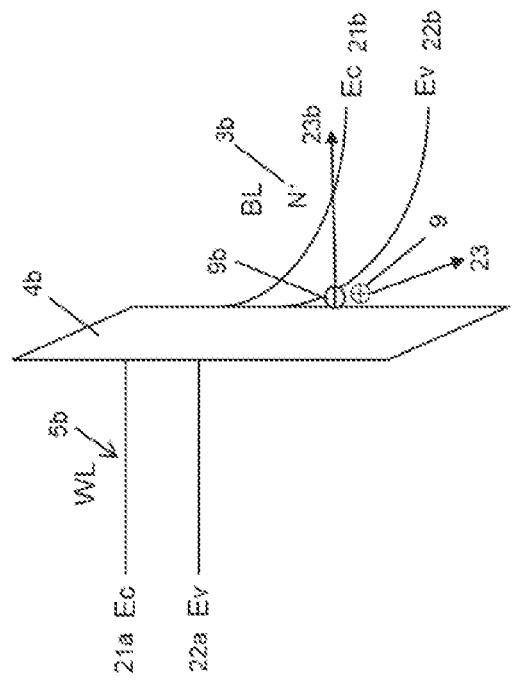

FIGS. 3AA to 3AD and FIG. 3B illustrate a write operation of the dynamic flash memory cell according to the first embodiment of the present invention.

A mechanism of the write operation will be described with reference to FIGS. 3AA and 3AB. FIG. 3AA is a band diagram for explaining a mechanism of generation of a gate-induced drain leakage current (which is an example of "gate-induced drain leakage current" in the claims). When the voltage applied to the second impurity layer 3b to which the bit line BL is connected is set to a voltage higher than the voltage applied to the second gate conductor layer 5b to which the word line WL is connected, a gate-induced drain leakage current (GIDL current) flows (see, for example, E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, Vol. 53, No. 4, pp. 692-697, April 2006).

Specifically, a valence band 22b and a conduction band 21b in a second boundary region (which is an example of "second boundary region" in the claims) between the second channel semiconductor layer 7b and the second impurity layer 3b are bent by an intense electric field between the second gate conductor layer 5b and the second impurity layer 3b, and a group of electrons 9b (which is an example of "group of electrons" in the claims) generated by band-to-band tunneling 23b tunnel to the valence band 22b and the conduction band 21b and flow into the second impurity layer 3b. A group of positive holes 9 (which is an example of "group of positive holes" in the claims) generated at this time flow into the channel semiconductor layer 7 that is a floating body FB. This is indicated with a reference numeral 23 and is also illustrated in FIG. 3AB. As illustrated in FIG. 3AC, the generated group of positive holes 9 are majority carriers in the channel region 7, with which the channel region 7 is charged to a positive bias.

FIG. 3B illustrates voltages applied to main nodes at the time of a "1" write operation. FIG. 3B illustrates two cases, namely, a case of a memory cell for which a "1" write operation is performed and a case of a memory cell for which a "1" write operation is not performed and that is kept in a "0" erase state. First, in the case of a memory cell for which a "1" write operation is performed, a "1" write bit line voltage $V_{BL1}$ is applied to the bit line BL, a write source line voltage $V_{SLH}$ is applied to the source line SL, a plate line constant voltage $V_{PLL}$ is applied to the plate line PL, and a "1" write word line voltage $V_{WL1}$ is applied to the word line WL. Here, for example, $V_{BL1}$ is equal to 3.5 V, $V_{SLH}$ is equal to 2.5 V, $V_{PLL}$ is equal to 1 V, $V_{WL1}$ is equal to 0 V, and the voltage of the word line WL is lower than the voltage of the bit line BL by 3.5 V, which is a state in which a gate-induced drain leakage current sufficiently flows.

In contrast, in the case of a memory cell, illustrated in FIG. 3B, that is kept in a "0" erase state, a "0" erase bit line voltage $V_{BL0}$ is applied to the bit line BL, the write source line voltage $V_{SLH}$ is applied to the source line SL, the plate line constant voltage $V_{PLL}$ is applied to the plate line PL, and a "0" erase word line voltage $V_{WL0}$ is applied to the word line WL. Here, for example, $V_{BL0}$ is equal to 2.5 V, $V_{SLH}$ is equal to 2.5 V, $V_{PLL}$ is equal to 1 V, $V_{WL0}$ is equal to 2.5 V, the voltage of the word line WL is equal to the voltage of the bit line BL, and a gate-induced drain leakage current does not flow. As a result, a "1" write operation does not occur in this memory cell, and the "0" erase state is maintained.

Next, when the "1" write operation ends, the bit line BL, the source line SL, and the word line WL return to a reset voltage Vss. Here, Vss is equal to, for example, 0 V. The plate line PL is kept at the plate line constant voltage $V_{PLL}$. At this time, as illustrated in FIG. 3AC, the generated group of positive holes 9 are majority carriers in the channel region 7, with which the channel region 7 is charged to a positive bias. The N⁺ layer 3a to which the source line SL is connected and the N⁺ layer 3b to which the bit line BL is connected are at 0 V, and therefore, the channel region 7 changes to a built-in voltage Vb (about 0.7 V) because of a first PN junction (which is an example of "first PN junction" in the claims) between the N⁺ layer 3a to which the source line SL is connected and the channel region 7 and a second PN junction (which is an example of "second PN junction" in the claims) between the N⁺ layer 3b to which the bit line BL is connected and the channel region 7. When the channel region 7 is charged to a positive bias, the threshold voltages of a first N-channel MOS transistor region and a second N-channel MOS transistor region decrease due to a substrate bias effect.

Accordingly, as illustrated in FIG. 3AD, the threshold voltage of the second N-channel MOS transistor region of the second channel region 7b to which the word line WL is connected decreases. The memory write operation (which is an example of "memory write operation" in the claims) in which the voltage in the "1" write state of the channel region 7 is assumed to be a first data retention voltage is performed to assign logical storage data "1".

Note that the conditions of voltages applied to the bit line BL, the source line SL, the word line WL, and the plate line PL described above are examples for performing the write operation, and other operation conditions based on which the write operation can be performed may be employed.

A mechanism of a memory erase operation (which is an example of "memory erase operation" in the claims) will be described with reference to FIGS. 4AA to 4AC and FIG. 4B. The channel region 7 between the N⁺ layers 3a and 3b is electrically isolated from the substrate and functions as a floating body. FIG. 4AA illustrates a state before the erase operation, in which the group of positive holes 9 generated by a gate-induced drain leakage current in the previous are stored in the channel region 7. As illustrated in FIG. 4AB, at the time of the erase operation, the voltage of the source line SL is set to a negative voltage $V_{ERA}$. Here, $V_{ERA}$ is equal to, for example, −3 V. As a result, regardless of the value of the initial potential of the channel region 7, the PN junction between the N⁺ layer 3a to which the source line SL is connected and that functions as the source and the channel region 7 is forward biased. As a result, the group of positive holes 9 generated by a gate-induced drain leakage current in the previous cycle and stored in the channel region 7 are drawn into the N+ layer 3a that functions as the source, the potential $V_{FB}$ of the channel region 7 becomes equal to $V_{FB}=V_{ERA}+Vb$, and this voltage value is a second data retention voltage. Here, Vb is the built-in voltage of the PN junction and is equal to about 0.7 V. Therefore, in a case of $V_{ERA}=-3$ V, the potential of the channel region 7 is equal to −2.3 V. This value indicates the potential state of the channel region 7 in an erase state. Therefore, when the potential of the channel region 7 that is a floating body becomes a negative voltage, the threshold voltage of an N-channel MOS transistor region increases due to a substrate bias effect.

Figure 4A:
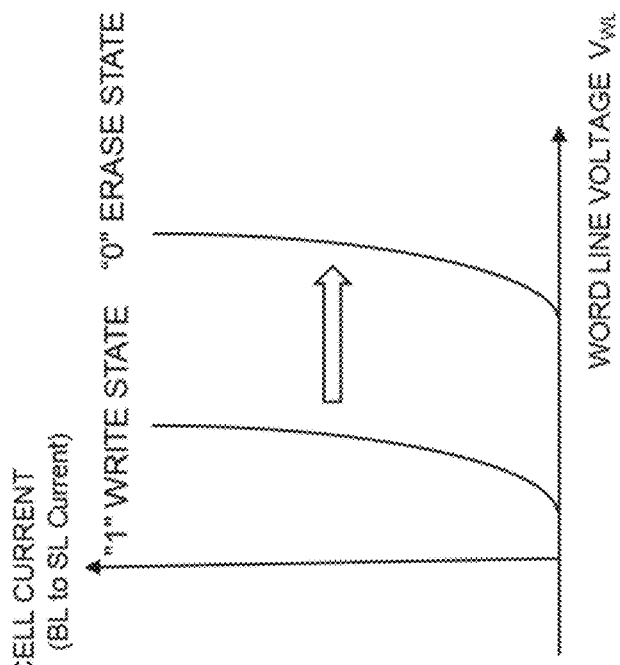
FIGS. 4AA to 4AC are diagrams for explaining a mechanism of an erase operation of the SGT-including memory device according to the first embodiment.
Figure 4A:
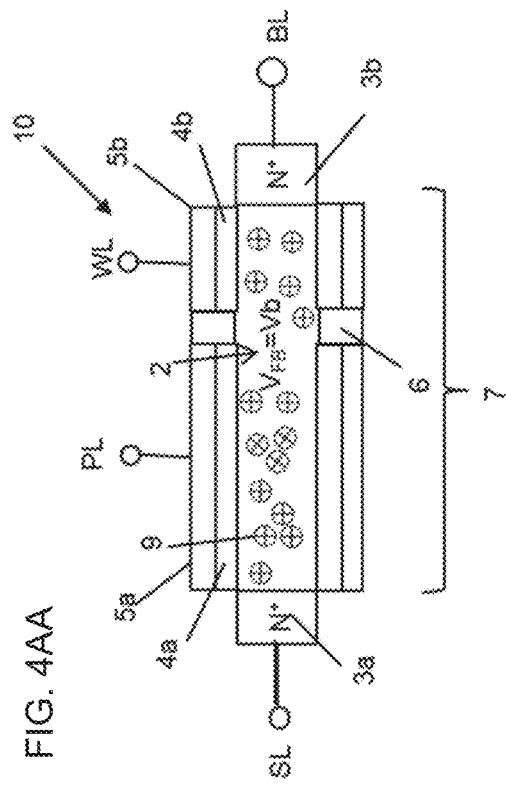
Figure 4A:
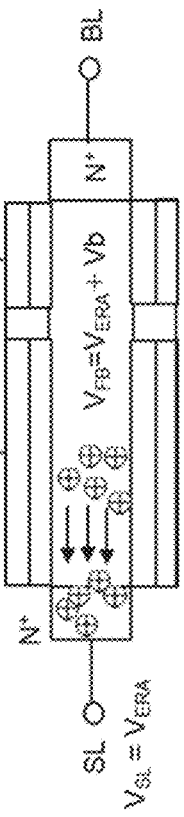

Accordingly, as illustrated in FIG. 4AC, the threshold voltage of the second gate conductor layer 5b to which the word line WL is connected increases. This erase state of the channel region 7 corresponds to logical storage data "0". When the voltage applied to the first gate conductor layer 5a connected to the plate line PL is set to a voltage higher than the threshold voltage at the time of logical storage data "1" and lower than the threshold voltage at the time of logical storage data "0" in data reading, a property that a current does not flow even when the voltage of the word line WL is increased can be attained. FIG. 4B illustrates example voltage conditions for respective main node contact points at the time of the erase operation described above. When the memory erase operation ends, the source line SL returns to 0 V. As a result, both the first PN junction and the second PN junction are reverse biased, and the potential $V_{FB}$ of the channel region 7 is maintained.

Note that the conditions of voltages applied to the bit line BL, the source line SL, the word line WL, and the plate line PL described above are examples for performing the erase operation, and other operation conditions based on which the erase operation can be performed may be employed.

Figure 5C:
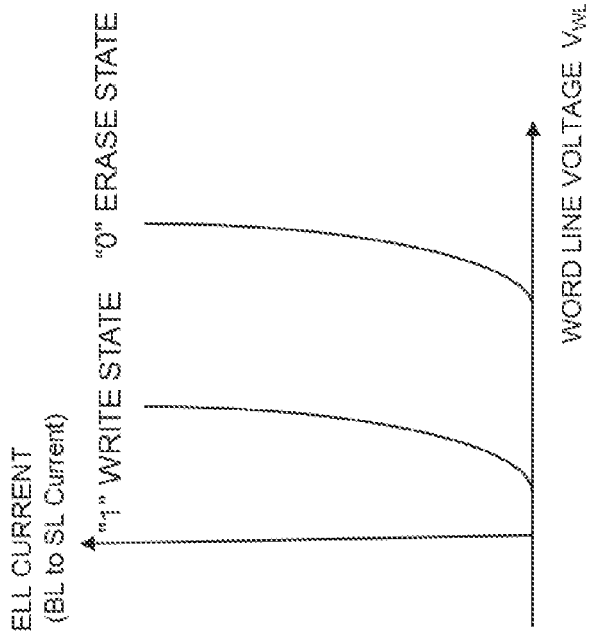
FIGS. 5A to 5C are diagrams for explaining a mechanism of a read operation of the SGT-including memory device according to the first embodiment.
Figure 5A:
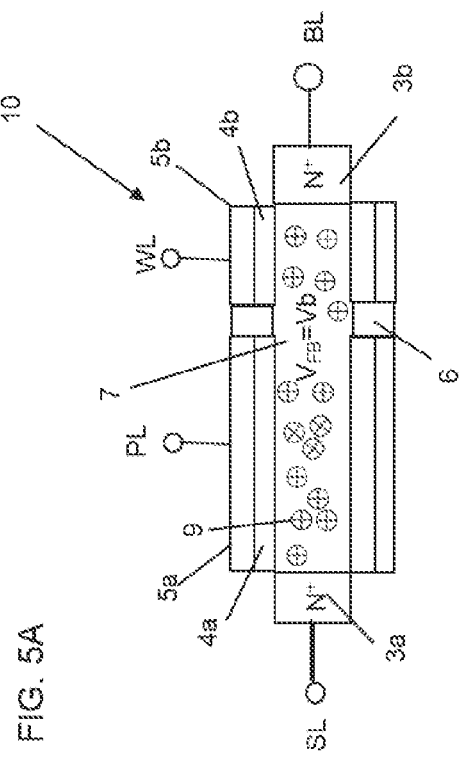
Figure 5B:
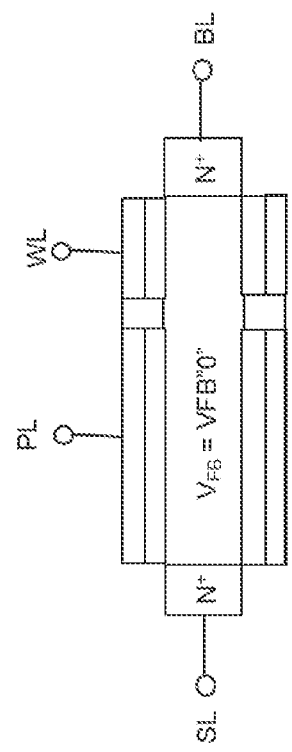
Figure 6A:
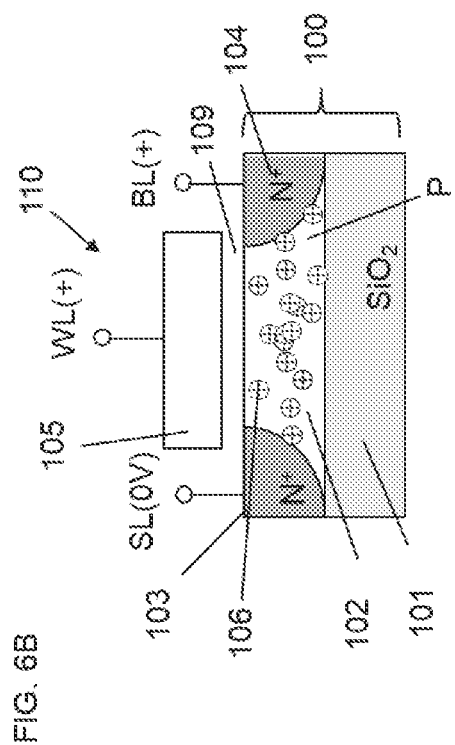
FIGS. 6A to 6D are diagrams for explaining a write operation of a DRAM memory cell including no capacitor in the related art.
Figure 6B:
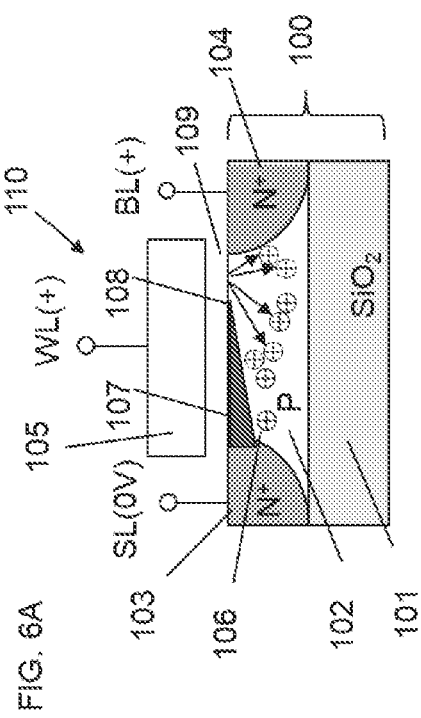
Figure 6C:
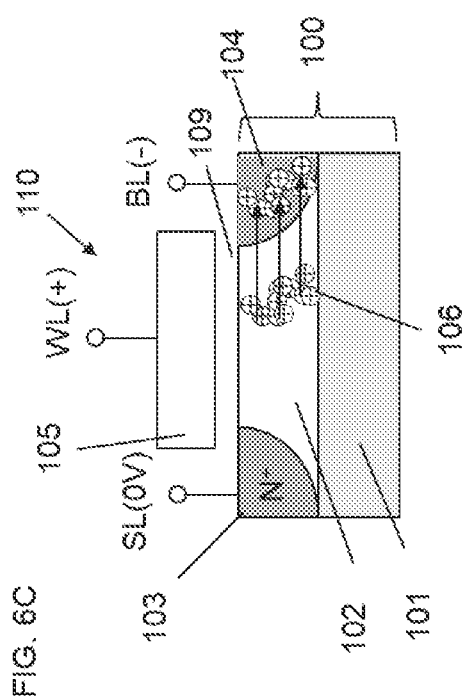
Figure 6D:
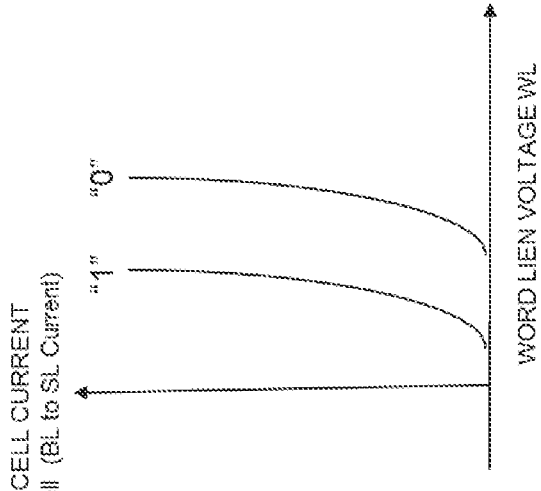
Figure 7A:
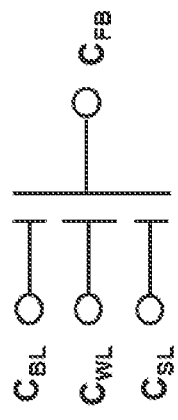
FIGS. 7A and 7B are diagrams for explaining a problem in the operation of the DRAM memory cell including no capacitor in the related art.
Figure 7B:
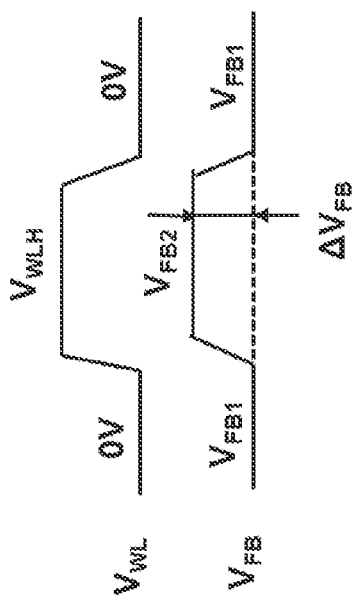

FIGS. 5A to 5C are diagrams for explaining a read operation of the dynamic flash memory cell according to the first embodiment of the present invention. As illustrated in FIG. 5A, when the channel region 7 is charged up to the built-in voltage Vb (about 0.7 V), the threshold voltage of the second N-channel MOS transistor region including the second gate conductor layer 5b to which the word line WL is connected decreases due to a substrate bias effect. This state is assigned to logical storage data "1". As illustrated in FIG. 5B, a memory block selected before writing is in an erase state "0" in advance, and the voltage $V_{FB}$ of the channel region 7 is equal to $V_{FB}$"0". With a write operation, a write state "1" is stored at random. As a result, logical storage data of logical "0" and that of logical "1" are created for the word line WL. As illustrated in FIG. 5C, the level difference between the two threshold voltages relative to the word line WL is used to perform reading by a sense amplifier.

Note that the conditions of voltages applied to the bit line BL, the source line SL, the word line WL, and the plate line PL described above are examples for performing the read operation, and other operation conditions based on which the read operation can be performed may be employed.

Note that in FIG. 1, it is desirable to make the length of the first gate conductor layer 5a, in the vertical direction, to which the plate line PL is connected further longer than the length of the second gate conductor layer 5b, in the vertical direction, to which the word line WL is connected to attain $C_{PL}>C_{WL}$. However, when only the plate line PL is added, the coupling ratio ($C_{WL}/(C_{PL}+C_{WL}+C_{BL}+C_{SL})$), of capacitive coupling, of the word line WL to the channel region 7 decreases. As a result, the potential change $\Delta V_{FB}$ of the channel region 7 that is a floating body decreases.

As the voltage $V_{PLL}$ of the plate line PL, for example, a fixed voltage of 2 V may be applied.

Regardless of whether the horizontal cross-sectional shape of the Si pillar 2 illustrated in FIG. 1 is a round shape, an elliptic shape, or a rectangular shape, the operations of the dynamic flash memory described in this embodiment can be performed. Further, a dynamic flash memory cell having a round shape, a dynamic flash memory cell having an elliptic shape, and a dynamic flash memory cell having a rectangular shape may coexist on the same chip.

With reference to FIG. 1, the dynamic flash memory element including, for example, an SGT in which the first gate insulating layer 4a and the second gate insulating layer 4b that surround the entire side surface of the Si pillar 2 standing on the substrate 1 in the vertical direction are provided and which includes the first gate conductor layer 5a and the second gate conductor layer 5b that entirely surround the first gate insulating layer 4a and the second gate insulating layer 4b has been described. As indicated in the description of this embodiment, the dynamic flash memory element needs to have a structure that satisfies the condition that the group of positive holes 9 generated by a gate-induced drain leakage current are retained in the channel region 7. For this, the channel region 7 needs to have a floating body structure isolated from the substrate 1. Accordingly, even when the semiconductor base material of the channel region is formed horizontally along the substrate 1 by using, for example, GAA (Gate All Around, see, for example, J. Y. Song, W. Y. Choi, J. H. Park, J. D. Lee, and B-G. Park: "Design Optimization of Gate-All-Around (GAA) MOSFETs", IEEE Trans. Electron Devices, vol. 5, no. 3, pp. 186-191, May 2006) technology, which is one type of SGT, or nanosheet technology (see, for example, N. Loubet, et al.: "Stacked Nanosheet Gate-All-Around Transistor to Enable Scaling Beyond FinFET", 2017 IEEE Symposium on VLSI Technology Digest of Technical Papers, T17-5, T230-T231, June 2017), the above-described operations of the dynamic flash memory can be performed. Alternatively, the dynamic flash memory element may have a device structure using SOI (Silicon On Insulator) (see, for example, J. Wan, L. Rojer, A. Zaslaysky, and S. Critoloveanu: "A Compact Capacitor-Less High-Speed DRAM Using Field Effect-Controlled Charge Regeneration", Electron Device Letters, Vol. 35, No. 2, pp. 179-181 (2012), T. Ohsawa, K. Fujita, T. Higashi, Y. Iwata, T. Kajiyama, Y. Asao, and K. Sunouchi: "Memory design using a one-transistor gain cell on SOI", IEEE JSSC, vol. 37, No. 11, pp. 1510-1522 (2002), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond", IEEE IEDM (2006), and E. Yoshida and T. Tanaka: "A Design of a Capacitorless 1T-DRAM Cell Using Gate-Induced Drain Leakage (GIDL) Current for Low-Power and High-Speed Embedded Memory", IEEE IEDM (2003)). In this device structure, the bottom portion of the channel region is in contact with an insulating layer of the SOI substrate, and the other portion of the channel region is surrounded by a gate insulating layer and an element isolation insulating layer. With such a structure, the channel region also has a floating body structure. Accordingly, the dynamic flash memory element provided in this embodiment needs to satisfy the condition that the channel region has a floating body structure. Even with a structure in which a Fin transistor (see, for example, H. Jiang, N. Xu, B. Chen, L. Zeng, Y. He, G. Du, X. Liu and X. Zhang: "Experimental investigation of self-heating effect (SHE) in multiple-fin SOI FinFETs", Semicond. Sci. Technol. 29 (2014) 115021 (7 pp)) is formed on an SOI substrate, as long as the channel region has a floating body structure, the operations of the dynamic flash memory can be performed.

Expressions (1) to (9) provided in the specification and in the drawings are expressions used to qualitatively explain the phenomena, and are not intended to limit the phenomena.

Although the reset voltages of the word line WL, the bit line BL, and the source line SL are specified as Vss in the descriptions of FIGS. 3AA to 3AD and FIG. 3B, the reset voltages of the respective lines may be set to different voltages.

Although FIG. 4B illustrates example conditions of the erase operation, the voltages applied to the source line SL, the plate line PL, the bit line BL, and the word line WL may be changed as long as a state in which the group of positive holes 9 in the channel region 7 are discharged through either the N$^+$ layer 3a or the N$^+$ layer 3b or both the N$^+$ layer 3a and the N$^+$ layer 3b can be attained. Further, in the block erase operation, the erase voltage may be applied to the source line SL of a selected block, and the bit line BL may be put in a floating state.

In FIG. 1, in the vertical direction, in a part of the channel region 7 surrounded by the insulating layer 6 that is the first insulating layer, the potential distribution of the first channel region 7a and that of the second channel region 7b are connected and formed. Accordingly, the first channel region 7a and the second channel region 7b that constitute the channel region 7 are connected in the vertical direction in the region surrounded by the insulating layer 6 that is the first insulating layer.

In FIG. 1, the first gate conductor layer 5a may be divided into two or more gate conductor layers, and the gate conductor layers may each function as a conductive electrode of the plate line and may be operated synchronously or asynchronously at the same driving voltage or different driving voltages. Similarly, the second gate conductor layer 5b may be divided into two or more gate conductor layers, and the gate conductor layers may each function as a conductive electrode of the word line and may be operated synchronously or asynchronously at the same driving voltage or different driving voltages. In this case, the operations of the dynamic flash memory can also be performed. In a case where the first gate conductor layer 5a is divided into two or more gate conductor layers, at least one of the first gate conductor layers obtained as a result of division assumes the roles of the first gate conductor layer 5a described above. In a case where the second gate conductor layer 5b is divided into two or more gate conductor layers, at least one of the second gate conductor layers obtained as a result of division assumes the roles of the second gate conductor layer 5b described above.

The above-described conditions of voltages applied to the bit line BL, the source line SL, the word line WL, and the plate line PL and the voltage of the floating body are examples for performing basic operations including the erase operation, the write operation, and the read operation, and other voltage conditions may be employed as long as basic operations of the present invention can be performed.

In FIG. 1, the first gate conductor layer 5a may be connected to the word line WL, and the second gate conductor layer 5b may be connected to the plate line PL. In this case, the operations of the dynamic flash memory described above can also be performed.

This embodiment has the following features.

Feature 1

The dynamic flash memory cell of this embodiment is constituted by the N$^+$ layers 3a and 3b that function as the source and the drain, the channel region 7, the first gate insulating layer 4a, the second gate insulating layer 4b, the first gate conductor layer 5a, and the second gate conductor layer 5b, which are formed in a pillar form as a whole. The N$^+$ layer 3a that functions as the source is connected to the source line SL, the N$^+$ layer 3b that functions as the drain is connected to the bit line BL, the first gate conductor layer 5a is connected to the plate line PL, and the second gate conductor layer 5b is connected to the word line WL. A structure is employed in which the gate capacitance of the first gate conductor layer 5a to which the plate line PL is connected is larger than the gate capacitance of the second gate conductor layer 5b to which the word line WL is connected, which is a feature. In the dynamic flash memory cell, the first gate conductor layer 5a and the second gate conductor layer 5b are stacked in the vertical direction. Accordingly, even when the structure is employed in which the gate capacitance of the first gate conductor layer 5a to which the plate line PL is connected is larger than the gate capacitance of the second gate conductor layer 5b to which the word line WL is connected, the memory cell area does not increase in plan view. Accordingly, a high-performance and highly integrated dynamic flash memory cell can be implemented. When the voltage applied to the first gate conductor layer 5a connected to the plate line PL is set to a voltage higher than the threshold voltage at the time of logical storage data "1" and lower than the threshold voltage at the time of logical storage data "0" in data reading, a property that a current does not flow even when the voltage of the word line WL is increased can be attained. This leads to a further increased operation margin of the dynamic flash memory cell.

Feature 2

In the dynamic flash memory cell according to the first embodiment of the present invention, the group of positive holes 9 are generated by a gate-induced drain leakage current at the time of a memory write operation, with which the channel semiconductor layer 7 is charged. Therefore, current consumption can be significantly decreased compared to a case where the group of positive holes 9 are generated by an impact ionization phenomenon that occurs in response to making a current flowing from the bit line BL to the source line SL.

Feature 3

In the dynamic flash memory cell according to the first embodiment of the present invention, at the time of erasing, a negative voltage is applied to the source line SL while the bit line BL can be kept in a floating state without applying a specific DC voltage thereto. As a result, a current does not flow from the bit line BL to the source line SL. Further, the erase voltage $V_{ERA}$ is applied to the source line SL and the potential $V_{FB}$ of the channel region 7 is equal to $V_{FB}=V_{ERA}+$ Vb, and therefore, the PN junction between the P-layer channel region 7 and the N$^+$ layer of the bit line BL is in a reverse bias state. Therefore, for example, a negative voltage, namely, the erase voltage $V_{ERA}$, need not be applied to the bit line BL. As a result, a buffer circuit that blocks the negative voltage to protect a circuit, such as a sense amplifier circuit, connected to the bit line BL need not be disposed between the sense amplifier circuit and the bit line BL, and this can significantly simplify the circuit design. A buffer circuit is not included, and therefore, this can reduce the chip area, and the dynamic flash memory can be provided at low cost. A buffer circuit is not included, and therefore, this enables a high-speed sensing operation of the sense amplifier circuit.

Feature 4

In terms of the roles of the first gate conductor layer 5a to which the plate line PL is connected in the dynamic flash memory cell according to the first embodiment of the present invention, in the write operation and in the read operation performed by the dynamic flash memory cell, the voltage of the word line WL changes. At this time, the plate line PL assumes the role of decreasing the capacitive coupling ratio between the word line WL and the channel region 7. As a result, an effect on changes in the voltage of the channel region 7 when the voltage of the word line WL changes can be substantially suppressed. Accordingly, the difference between the threshold voltages of the SGT transistor of the word line WL indicating logical "0" and logical "1" can be increased. This leads to an increased operation margin of the dynamic flash memory cell.

OTHER EMBODIMENTS

Although the Si pillar is formed in the present invention, the Si pillar may be a semiconductor pillar made of a semiconductor material other than Si. This is similarly applicable to other embodiments according to the present invention.

In vertical NAND-type flash memory circuits, memory cells that are stacked in a plurality of stages in the vertical direction and each of which is constituted by a semiconductor pillar, which functions as the channel, and a tunnel oxide layer, a charge storage layer, an interlayer insulating layer, and a control conductor layer that surround the semiconductor pillar are formed. At the semiconductor pillars on both ends of these memory cells, a source line impurity layer corresponding to the source and a bit line impurity layer corresponding to the drain are disposed respectively. In addition, for one memory cell, when one of the memory cells on both sides of the one memory cell functions as the source, the other functions as the drain. Accordingly, the vertical NAND-type flash memory circuit is one type of SGT circuit. Therefore, the present invention is also applicable to a circuit in which a NAND-type flash memory circuit coexists.

Even with a structure in which the polarities of the conductivity types of the N+ layers 3a and 3b and the P-layer Si pillar 2 in FIG. 1 are reversed, the operations of the dynamic flash memory can be performed. In this case, in the Si pillar 2 that is of N-type, the majority carriers are electrons. Therefore, a group of electrons generated by a gate-induced drain leakage (GIDL) current is stored in the channel region 7, and a "1" state is set.

Various embodiments and modifications can be made to the present invention without departing from the spirit and scope of the present invention in a broad sense. The above-described embodiments are intended to explain examples of the present invention and are not intended to limit the scope of the present invention. Any of the above-described embodiments and modifications can be combined. Further, the above-described embodiments from which some of the configuration requirements are removed as needed are also within the scope of the technical spirit of the present invention.

With the semiconductor-element-including memory device according to the present invention, a high-density and high-performance dynamic flash memory that is an SGT-including memory device can be obtained.

What is claimed is:

1. A semiconductor memory device comprising:
a semiconductor base material that stands on a substrate in a vertical direction relative to the substrate or that extends along the substrate in a horizontal direction;
a first impurity layer and a second impurity layer that are disposed at respective ends of the semiconductor base material;
a first gate insulating layer that partially or entirely surrounds a side surface of the semiconductor base material between the first impurity layer and the second impurity layer and that is in contact with or in close vicinity to the first impurity layer;
a second gate insulating layer that partially or entirely surrounds the side surface of the semiconductor base material, that is connected to the first gate insulating layer, and that is in contact with or in close vicinity to the second impurity layer;
a first gate conductor layer that covers the first gate insulating layer;
a second gate conductor layer that covers the second gate insulating layer; and
a channel semiconductor layer that is the semiconductor base material and that is constituted by a first channel semiconductor layer covered by the first gate insulating layer and a second channel semiconductor layer covered by the second gate insulating layer, wherein
a memory write operation is performed by controlling voltages applied to the first gate conductor layer, the second gate conductor layer, the first impurity layer, and the second impurity layer to perform an operation of discharging a group of electrons among the group of electrons and a group of positive holes through the first impurity layer or the second impurity layer, the group of electrons and the group of positive holes being generated inside the channel semiconductor layer in a first boundary region between the first impurity layer and the channel semiconductor layer or in a second boundary region between the second impurity layer and the channel semiconductor layer by a gate-induced drain leakage current, and an operation of keeping some or all of the group of positive holes retained in the channel semiconductor layer, and
a memory erase operation is performed by controlling the voltages applied to the first gate conductor layer, the second gate conductor layer, the first impurity layer, and the second impurity layer to discharge the group of positive holes through either the first impurity layer or the second impurity layer or both the first impurity layer and the second impurity layer.

2. The semiconductor memory device according to claim 1, wherein
in the memory erase operation, a first PN junction between the first impurity layer and the channel semiconductor layer and a second PN junction between the second impurity layer and the channel semiconductor layer are kept in a reverse bias state.

3. The semiconductor memory device according to claim 1, wherein a source line is connected to the first impurity layer, a bit line is connected to the second impurity layer, and when a word line is connected to one of the first gate conductor layer or the second gate conductor layer, a first driving control line is connected to the other of the first gate conductor layer or the second gate conductor layer, and the memory erase operation or the memory write operation is selectively performed in accordance with voltages applied to the source line, the bit line, the first driving control line, and the word line.

4. The semiconductor memory device according to claim 3, wherein
the bit line is orthogonal to the word line in plan view.

5. The semiconductor memory device according to claim 1, wherein
a first gate capacitance between the first gate conductor layer and the channel semiconductor layer is larger than a second gate capacitance between the second gate conductor layer and the channel semiconductor layer.

6. The semiconductor memory device according to claim 5, wherein
the first gate capacitance is made larger than the second gate capacitance by any of making a first channel length of the first gate conductor layer longer than a second channel length of the second gate conductor layer, making the first gate insulating layer thinner than the second gate insulating layer, or making a relative dielectric constant of the first gate insulating layer higher than a relative dielectric constant of the second gate insulating layer, or by a combination thereof.

7. The semiconductor memory device according to claim 1, wherein
the first impurity layer and the second impurity layer are N-type semiconductor layers, and the channel semiconductor layer is a P-type semiconductor layer or a neutral semiconductor layer, and
in response to a start of the memory erase operation, the memory erase operation is performed by performing a group-of-positive-holes discharge operation in which the first impurity layer is set at a voltage lower than a voltage of the channel semiconductor layer, a first PN junction between the first impurity layer and the channel semiconductor layer is forward biased, and the group of positive holes are discharged from the channel semiconductor layer to the first impurity layer, and
a group-of-positive-holes discharge stop operation that is subsequently performed and in which the first impurity layer is set at a voltage higher than the voltage of the channel semiconductor layer, the first PN junction is reverse biased, and discharging of the group of positive holes is stopped.

8. The semiconductor memory device according to claim 1, comprising:
the semiconductor base material that is formed perpendicular to a substrate;
the first impurity layer that is formed in the semiconductor base material in a vicinity of the substrate;
the first channel semiconductor layer that is formed on the first impurity layer in the semiconductor base material;
the second channel semiconductor layer that is formed on the first channel semiconductor layer in the semiconductor base material;
the second impurity layer that is formed on the second channel semiconductor layer in the semiconductor base material;
the first gate insulating layer that surrounds the first channel semiconductor layer;
the second gate insulating layer that surrounds the second channel semiconductor layer;
the first gate conductor layer that surrounds the first gate insulating layer;
the second gate conductor layer that surrounds the second gate insulating layer; and
a first insulating layer that is disposed between the first gate conductor layer and the second gate conductor layer.

* * * * *